US006800880B1

United States Patent
Tsai

(10) Patent No.: US 6,800,880 B1
(45) Date of Patent: Oct. 5, 2004

(54) HETEROJUNCTION BIPOLAR TRANSISTORS WITH EXTREMELY LOW OFFSET VOLTAGE AND HIGH CURRENT GAIN

(75) Inventor: Jung-Hui Tsai, Kaohsiung (TW)

(73) Assignee: National Kaohsiung Normal University, Kaohsiung (TW)

( * ) Notice: Subject to any disclaimer, the term of this patent is extended or adjusted under 35 U.S.C. 154(b) by 0 days.

(21) Appl. No.: 10/636,604

(22) Filed: Aug. 8, 2003

(51) Int. Cl.[7] .................................. H01L 31/072
(52) U.S. Cl. ............... 257/197; 257/198; 257/565; 257/578; 257/590; 257/591; 438/312; 438/343
(58) Field of Search ................... 257/197, 198, 257/565, 578, 590, 591; 438/312, 343

(56) References Cited

U.S. PATENT DOCUMENTS 5,965,931 A * 10/1999 Wang et al. ............ 257/585
6,320,212 B1 * 11/2001 Chow ..................... 257/197
6,479,844 B2 * 11/2002 Taylor .................... 257/192
6,737,684 B1 * 5/2004 Takagi et al. ............ 257/194

* cited by examiner

Primary Examiner—Minhloan Tran
Assistant Examiner—Remmon R. Fordé
(74) Attorney, Agent, or Firm—Bacon & Thomas PLLC

(57) ABSTRACT

Novel heterojunction bipolar transistors (HBT's) with high current gain and extremely low offset voltage are disclosed. Owing to the insertion of spacer/δ-doped sheet/spacer at base-emitter (B-E) heterojunction in this invention, the potential spike at B-E junction can be eliminated and the confinement effect for holes are enhanced. The potential spike is not observed under large B-E bias, and the offset voltage is still relatively small with small increase. In particular, for the HBT's with large conduction band discontinuity, the method of the invention is more efficient for completely eliminating the potential spike. For the example of InP/GaInAs HBT, a maximum common-emitter current gain of 455 and above 320 at $I_B=5$ μA, and a low offset voltage less 60 mV are achieved.

18 Claims, 6 Drawing Sheets

HETEROJUNCTION BIPOLAR TRANSISTORS WITH EXTREMELY LOW OFFSET VOLTAGE AND HIGH CURRENT GAIN

FIELD OF THE INVENTION

This invention is related to Heterojunction Bipolar Transistor (HBT), especially the new HBT featuring extremely low offset voltage and high current gain.

BACKGROUND OF THE INVENTION

In the past years, Heterojunction Bipolar Transistors (HBT's) made up of compound semiconductor has been in widespread use for microwave, high-speed and power circuit fields. In industries of emerging personal communication, satellite communication, and wireless data transmission, the device based on InP substrate is suitable for optical integrated circuit application, while HBT whose base is made up of GaInAs has been popularly applied to reduce the transient time and to increase operating frequency range. In addition, because the surface combination rate of GaInAs base is very low, the combined current on the surface of the junction is reduced, and the current gain is raised. Also, the reliability is increased because of the independent relationship between the transistor's characteristic and the area size of the device. However, as far as conventional AlInAs/GaInAs HBT's are concerned, the conduction band discontinuity ($\Delta E_C$) at the AlInAs/GaInAs junction is quite large (about 0.55 eV), so the potential spike at the base-emitter junction will make the offset voltage ($\Delta V_{CE}$) at the collector-emitter junction so high as to dissipate the usable power for circuit applications. This disadvantage makes it unsuitable for integrated circuit's operation. As for InP/GaInAs HBT's, the valence band discontinuity ($\Delta E_V$) at the InP/GaInAs junction is quite large (about 0.35 eV). So, the confinement effect for holes, the emitter injection efficiency, and the current gain are pretty high. However, although the conduction band discontinuity ($\Delta E_C$) at the InP|GaInAs junction is smaller than that of the AlInAs/GaInAs junction, it is, still a little large (about 0.25 eV) such that the offset voltage ($\Delta V_{CE}$) at the collector-emitter junction can't be neglected. In the past, a lot of countries devoted themselves to the cutting-edge research and development of the HBT's, and a variety of practical HBT devices with characteristics of high current gain and extremely low offset voltage are presented, such as all kinds of Heterostructure Emitter Bipolar Transistor (HEBT), GaInP/GaAs double HBT's (DHBT's), Resonant-Tunneling Heterojunction-Emitter Bipolar Transistors (RT-HEBT's), Spacer HBT's, and δ-doped Heterojunction Bipolar Transistors (δ-HBT's). The aforementioned devices already had remarkable experimental performances. In the last few years, inventors who have worked on AlInAs/GaInAs HEBT found that inserting a 500 Å n-GaInAs emitter layer into the n-AlInAs/p+-GaInAs base-emitter junction makes its offset voltage down to only 40 mV. But the diffusion distance of the holes of the GaInAs is so narrow that the electron-hole at the neutralized emitter region combines with each other easily. Thus the current gain is decreased with the increment of the base current. European Patent Publication No. 0778622 (1997) discloses a new Heterojunction Bipolar Transistor (HBT). In this invention, a δ-doped/spacer layer is inserted into the base-emitter heterojunction to eliminate the potential spike and to raise the current gain. However, the doping concentration of the δ-doped layer has to reach extraordinarily high so that the potential spike can be eliminated completely and effectively. Besides, the δ-doping may diffuse out to the large energy-gap emitter layer, so it is unfavorable for the completeness and the quality of the base-emitter heterojunction.

SUMMARY OF THE INVENTION

This invention discloses one new Heterojunction Bipolar Transistors (HBT's) with characteristics of high current gain and extremely low offset voltage. In the present invention, the spacer/δ-doped/spacer layer is inserted into the base-emitter heterojunction. It can eliminate the potential spike and enhance the confinement effect for holes. More importantly, the potential spike of the HBT's in the present invention can be eliminated completely and effectively without the highly doped concentration of the δ-doped. Besides, when the base-emitter bias is very high, the potential spike still doesn't appear and the offset voltage is still low. These advantages can help to improve the device characteristics on circuit applications, especially for the HBT's with large conduction band discontinuity ($\Delta E_C$). In addition, the device of the present invention is easy to be implemented and stable to operate at room temperature.

A structure of heterojunction bipolar transistor constructed according to one aspect of the present invention comprises a semi-insulated InP semiconductor substrate, a $n^+$ subcollector layer on said semi-insulated InP semiconductor substrate, a $n^-$ collector layer on said $n^+$ subcollector layer, a $p^+$ base layer on said $n^-$ collector layer, a first non-doped spacer layer on said $p^+$ base layer, a $n^+$ δ-doped layer on said first non-doped spacer layer, a second non-doped spacer layer on said $n^+$ δ-doped layer, a n-type emitter layer on said second non-doped spacer layer, and a $n^+$ ohmic contact layer on said n-type emitter layer.

Preferably, said $n^+$ subcollector layer is $Ga_{0.47}In_{0.53}As$, and has a thickness of 0.2 to 1 μm, and a concentration of $n=1\times10^{18}$ to $3\times10^{19}$ cm$^{-3}$.

Preferably, said $n^-$ collector layer is $Ga_{0.47}In_{0.53}As$, and has a thickness of 0.2 to 1 μm, and a concentration of $n^-=1\times10^{16}$ to $1\times10^{17}$ cm$^{-3}$.

Preferably, said $p^+$ base layer is $Ga_{0.47}In_{0.53}As$, and has a thickness of 0.05 to 0.2 μm, and a concentration of $p=1\times10^{18}$ to $4\times10^{19}$ cm$^{-3}$.

Preferably, said first non-doped spacer is $Ga_{0.47}In_{0.53}As$, and has a thickness of 10 to 200 Å.

Preferably, said $n^+$ δ-doped layer has a concentration of $\delta(n^+)=1\times10^{12}$ to $1\times10^{13}$ cm$^{-3}$.

Preferably, said second non-doped spacer is $Ga_{0.47}In_{0.53}As$, and has a thickness of 10 to 200 Å.

Preferably, said n-type emitter layer is InP or $Al_{0.48}In_{0.52}As$, and has a thickness of 0.05 to 0.2 μm, and a concentration of $n=1\times10^{17}$ to $1\times10^{18}$ cm$^{-3}$.

Preferably, said $n^+$ ohmic contact layer is $Ga_{0.47}In_{0.53}As$, and has a thickness of 0.1 to 0.5 μm, and a concentration of $n=1\times10^{18}$ to $3\times10^{19}$ cm$^{-3}$.

A structure of heterojunction bipolar transistor constructed according to another aspect of the present invention comprises a semi-insulated GaAs semiconductor substrate, a $n^+$ subcollector layer on said semi-insulated GaAs semiconductor substrate, a $n^-$ collector layer on said $n^+$ subcollector layer, a $p^+$ base layer on said $n^-$ collector layer, a first non-doped spacer layer on said $p^+$ base layer, a $n^+$ δ-doped layer on said first non-doped spacer layer, a second non-doped spacer layer on said $n^+$ δ-doped layer, a n-type emitter layer on said second non-doped spacer layer, and a $n^+$ ohmic contact layer on said n-type emitter layer. Preferably, said $n^+$ subcollector layer is GaAs, and has a thickness of 0.2 to 1 μm, and a concentration of $n=1\times10^{18}$ to $3\times10^{19}$ cm$^{-3}$. Preferably, said $n^-$ collector layer is GaAs, and has a thickness of 0.2 to 1 μm, and a concentration of $n^-=1\times10^{16}$ to $1\times10^{17}$ cm$^{-3}$. Preferably, said $p^+$ base layer is GaAs, and has a thickness of 0.05 to 0.2 μm, and a concentration of $p=1\times10^{18}$ to $4\times10^{19}$ cm$^{-3}$. Preferably, said first non-doped spacer is GaAs, and has a thickness of 10 to 200 Å. Preferably, said $n^+$ δ-doped layer has a concentration of $\delta(n^+)=1\times10^{12}$ to $1\times10^{13}$ cm$^{-3}$. Preferably, said second non-doped spacer is GaAs, and has a thickness of 10 to 200 Å. Preferably, said n-type emitter layer is $In_{0.5}Ga_{0.5}P$ or $Al_xGa_{1-x}As$, wherein x is of 02 to 0.55, and has a thickness of 0.05 to 0.2 μm, and a concentration of $n=1\times10^{17}$ to $1\times10^{18}$ cm$^{-3}$. Preferably, said $n^+$ ohmic contact layer is GaAs, and has a thickness of 0.1 to 0.5 μm, and a concentration of $n=1\times10^{18}$ to $3\times10^{19}$ cm$^{-3}$.

LEGENDS

101 semiconductor substrate.
102 $n^+$ subcollector.
103 $n^-$ collector layer.
104 $p^+$ base layer.
105 first non-doped spacer.
106 $n^+$ δ-doped layer.
107 second non-doped spacer.
108 n-type emitter layer
109 $n^+$-type ohmic contact

DETAILED DESCRIPTION OF THE INVENTION

Figure 1:
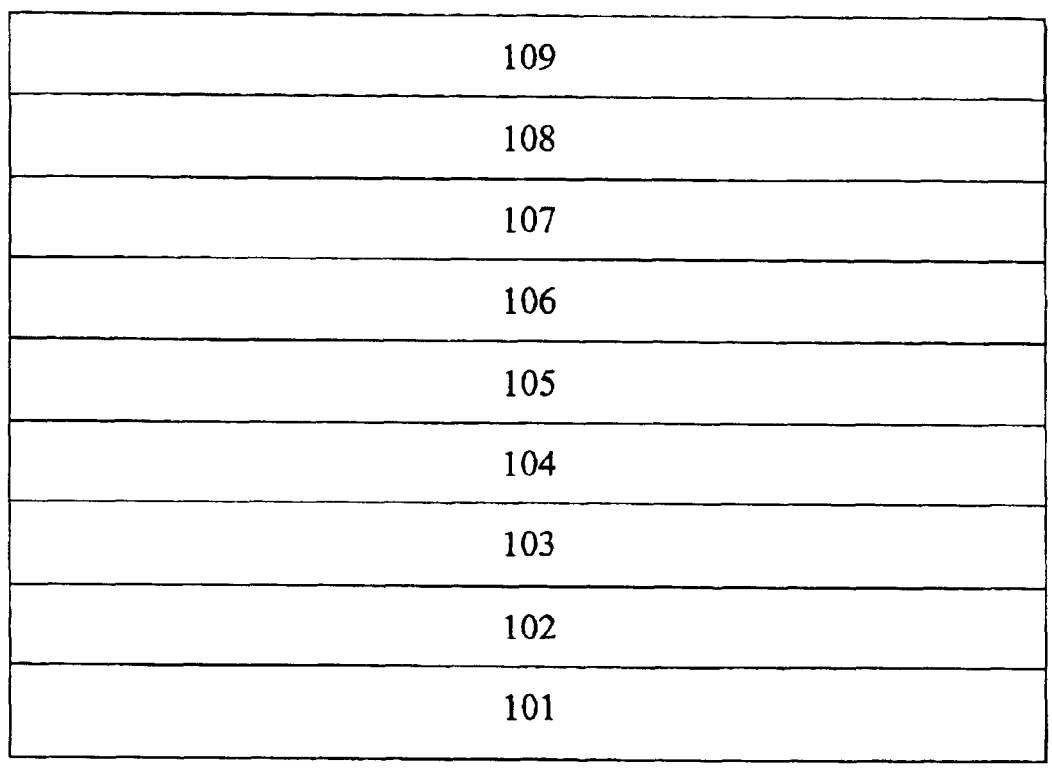
FIG. 1 is a schematic structure diagram showing a structure of a device of the present invention.

The present invention discloses one new Heterojunction Bipolar Transistors (HBT's) whose structure is illustrated in FIG. 1. From bottom to top, it consists of: the semi-insulated semiconductor substrate 101 on the basis, one $n^+$ subcollector 102, one layer of $n^-$ collector 103, one layer of $p^+$ base layer 104, one layer of first non-doped spacer 105, one layer of $n^+$ δ-doped 106, one layer of second non-doped spacer 107, one layer of n-type emitter 108, and one layer of $n^+$ ohmic contact 109.

This invention can be further understood by the following examples, which are merely for illustration, not for restriction of the scope of the present invention.

EXAMPLES

Figure 2:
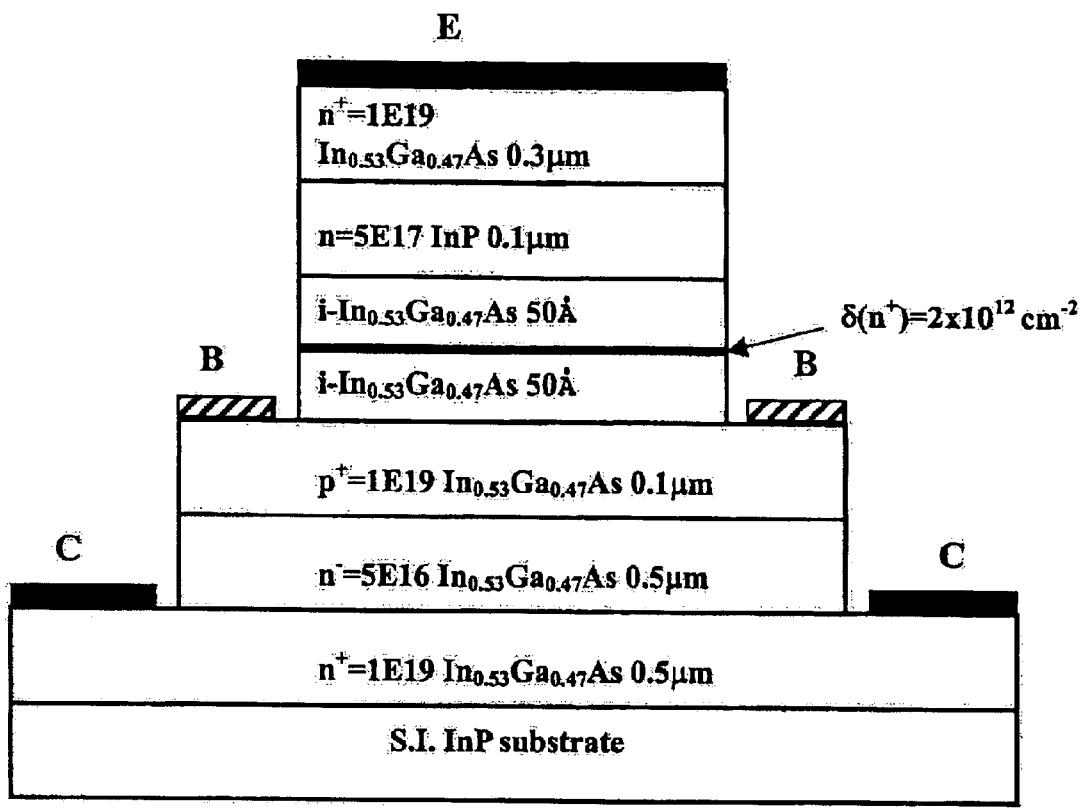
FIG. 2 shows a cross-sectional diagram of a structure of a device constructed according to an example of the present invention.

First of all, on a semi-insulated InP substrate, one layer of $Ga_{0.47}In_{0.53}As$ subcollector with thickness of 0.5 μm and concentration of $n^+=1\times10^{19}$ cm$^{-3}$, one layer of $Ga_{0.47}In_{0.53}As$ collector with thickness of 0.5 μm and concentration of $n^-=5\times10^{16}$ cm$^{-3}$, one layer of $Ga_{0.47}In_{0.53}As$ base with thickness of 0.1 μm and concentration of $p^+=1\times10^{19}$ cm$^{-3}$, one layer of first non-doped $Ga_{0.47}In_{0.53}As$ spacer with thickness of 50 Å, one layer of δ-doped with concentration of $\delta(n^+)=2\times10^{12}$ cm$^{-3}$, one layer of $Ga_{0.47}In_{0.53}As$ second non-doped spacer with thickness of 50 Å, one layer of InP emitter with thickness of 0.1 μm and concentration of $n=5\times10^{17}$ cm$^{-3}$, and one layer of $Ga_{0.47}In_{0.53}As$ ohmic contact with thickness of 0.3 μm and concentration of $n^+=1\times10^{19}$ cm$^{-3}$ were formed in sequence. The cross section of the device is depicted as FIG. 2. Furthermore, on the ohmic contact layer, the base layer, and the collector layer an emitter lead E, a base lead B, and a collector lead C were formed, respectively.

Figure 3:
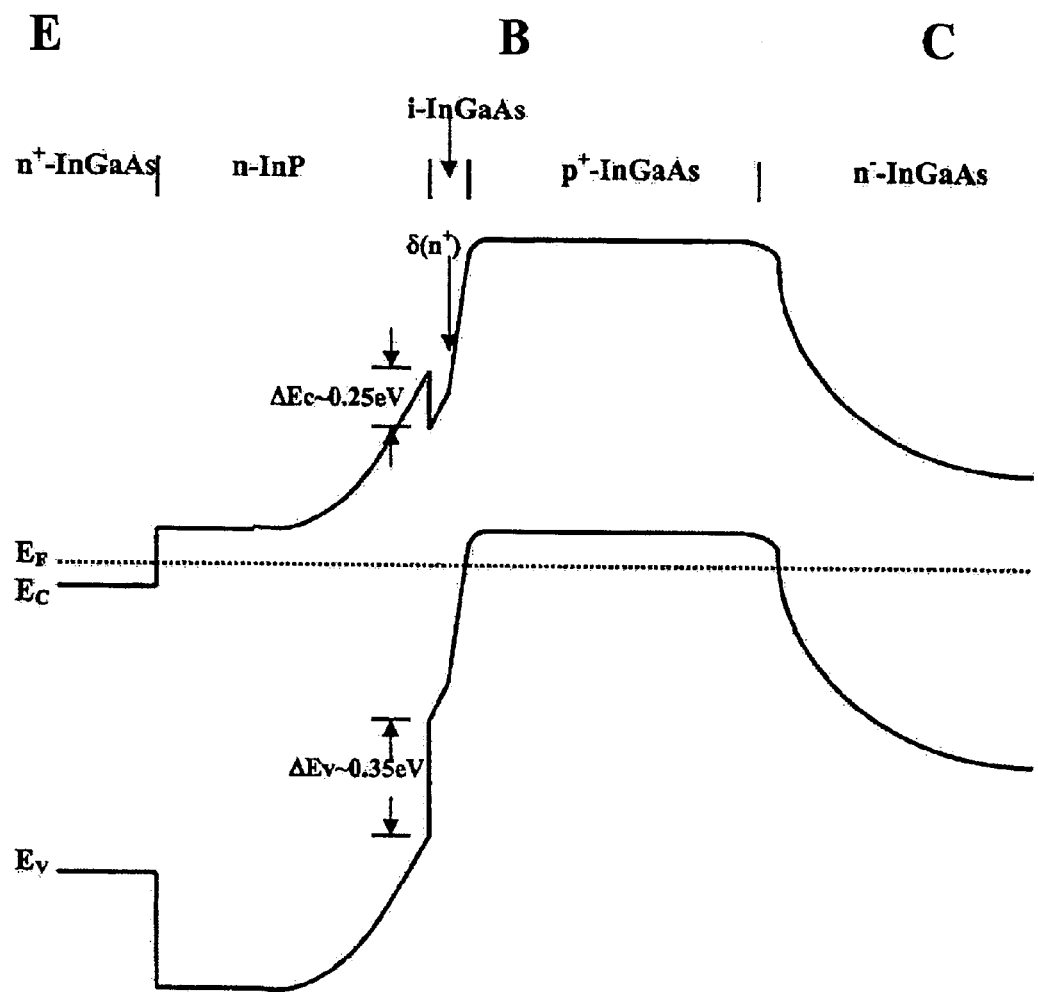
FIG. 3 shows the energy band diagram of the device constructed according to the example of the present invention at thermal equivalence.

The energy band diagram of the device at equilibrium is shown in FIG. 3. Due to the insertion of the spacer/δ-doped/spacer at the base-emitter junction, the confinement effect of holes is enhanced and lowers the emitter energy band at the emitter-base junction. Thus, it can achieve the low offset voltage and high current gain as the current is low.

Figure 4:
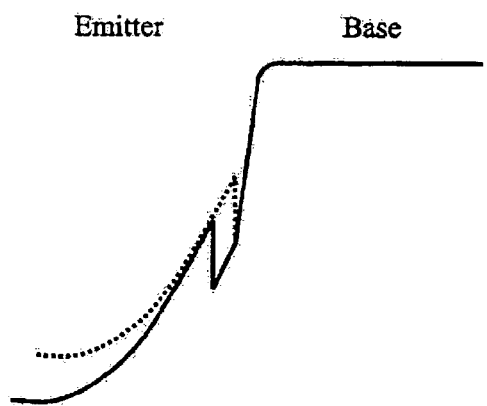
FIG. 4 shows the comparison of the energy bands of the conduction bands at equilibrium between the device constructed according to the example of the present invention and the conventional δ-HBT.

FIG. 4 shows the comparison of the energy band of the conduction band between the device of the present invention and the conventional δ-HBT at equilibrium. The solid line shows the energy band of the present invention, while the dotted line shows that of the conventional δ-HBT. In the present invention, the spacer/δ-doped/spacer is inserted at the base-emitter heterojunction, while in the conventional δ-HBT's, the δ-doped/spacer is inserted at the base-emitter heterojunction. Specifically, in the present invention, one more spacer is inserted at the junction between the δ-doped layer and the large energy-gap emitter layer, so that the potential spike can be eliminated more effectively and completely. Further, in the case where the base-emitter junction is highly biased, the potential spike will not appear and the offset voltage of the device of the present invention remains small. In addition, the device of the present invention can keep the completeness of the emitter-base heterojunction.

Figure 5:
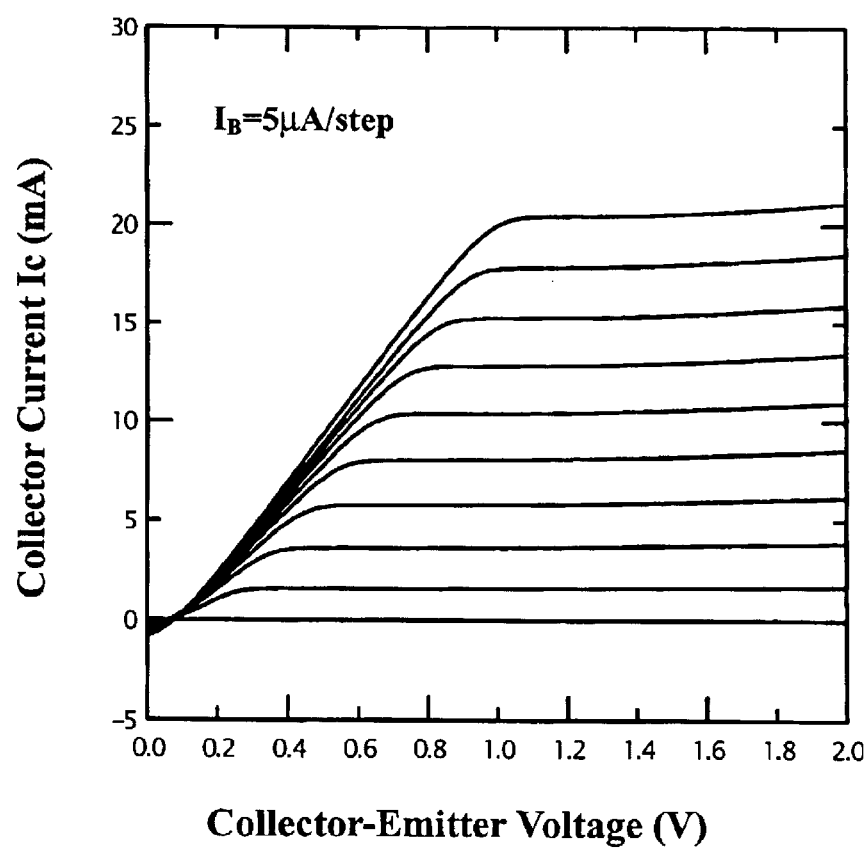
FIG. 5 shows the current-voltage characteristic plot of the device constructed according to the example of the present invention.

FIG. 5 shows the current-voltage characteristic of the device of the present invention measured at room temperature. When $I_B=45$ μA, $I_C=21$ mA. When the base current is low ($I_B$ is about 5 μA), the current gain achieves over 320, and the offset voltage ($\Delta V_{CE}$) is under 60 mA. It can seen from this characteristic curve that the insertion of the spacer/δ-doped/spacer at the base-emitter heterojunction accomplishes characteristics of low offset voltage, high linearity, and high current gain.

Figure 6:
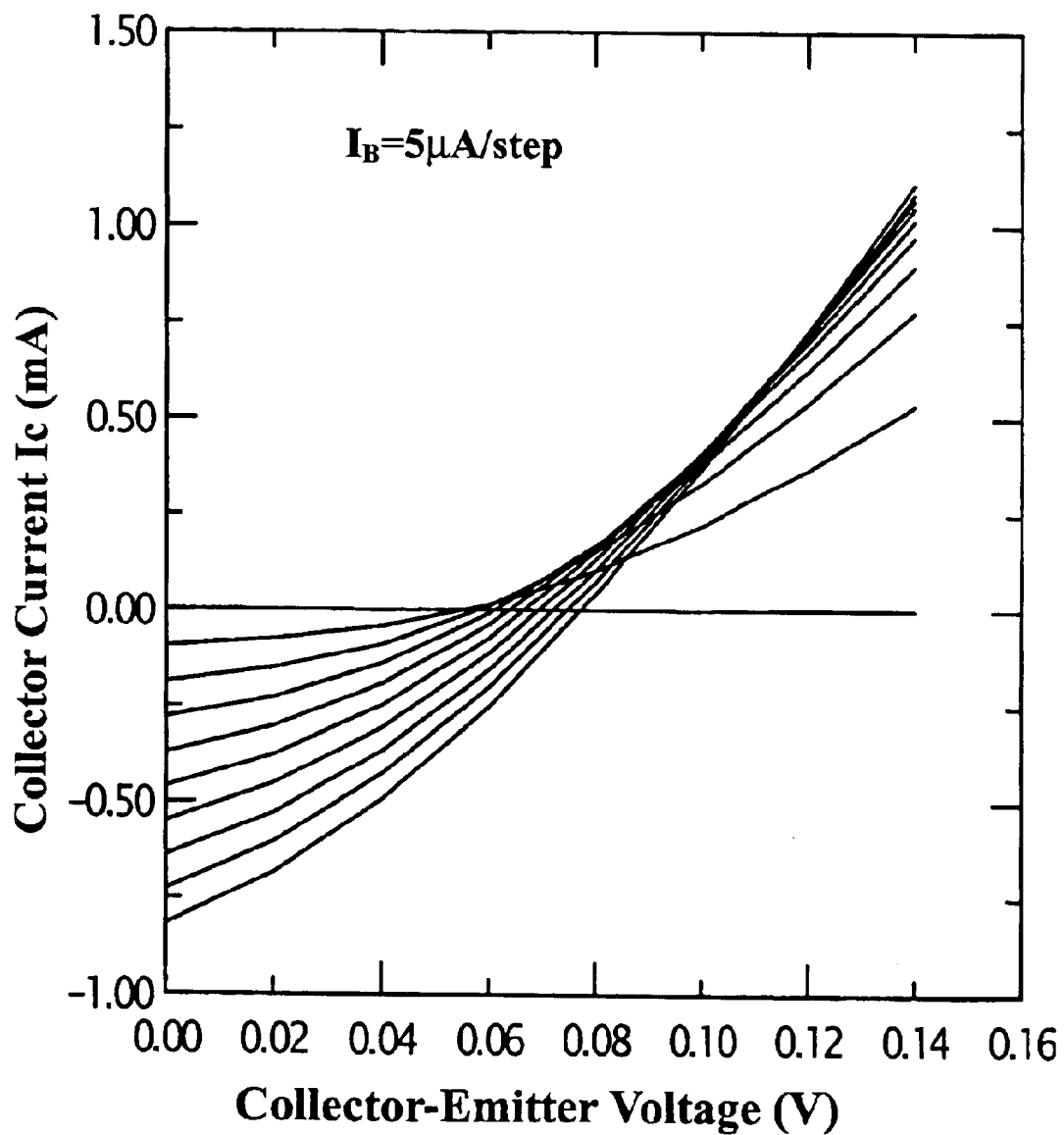
FIG. 6 shows the magnified current-voltage characteristic plot near the origin of the small current at room temperature of the device constructed according to the example of the present invention.

FIG. 6 illustrates the magnified current-voltage characteristic plot near the origin of the small current at room temperature of the device of the present invention. The offset voltage of the device of the present invention increases a little and linearly, when the base current is large. Therefore, the potential spike will still not appear as the base-emitter junction is highly biased.

Figure 7:
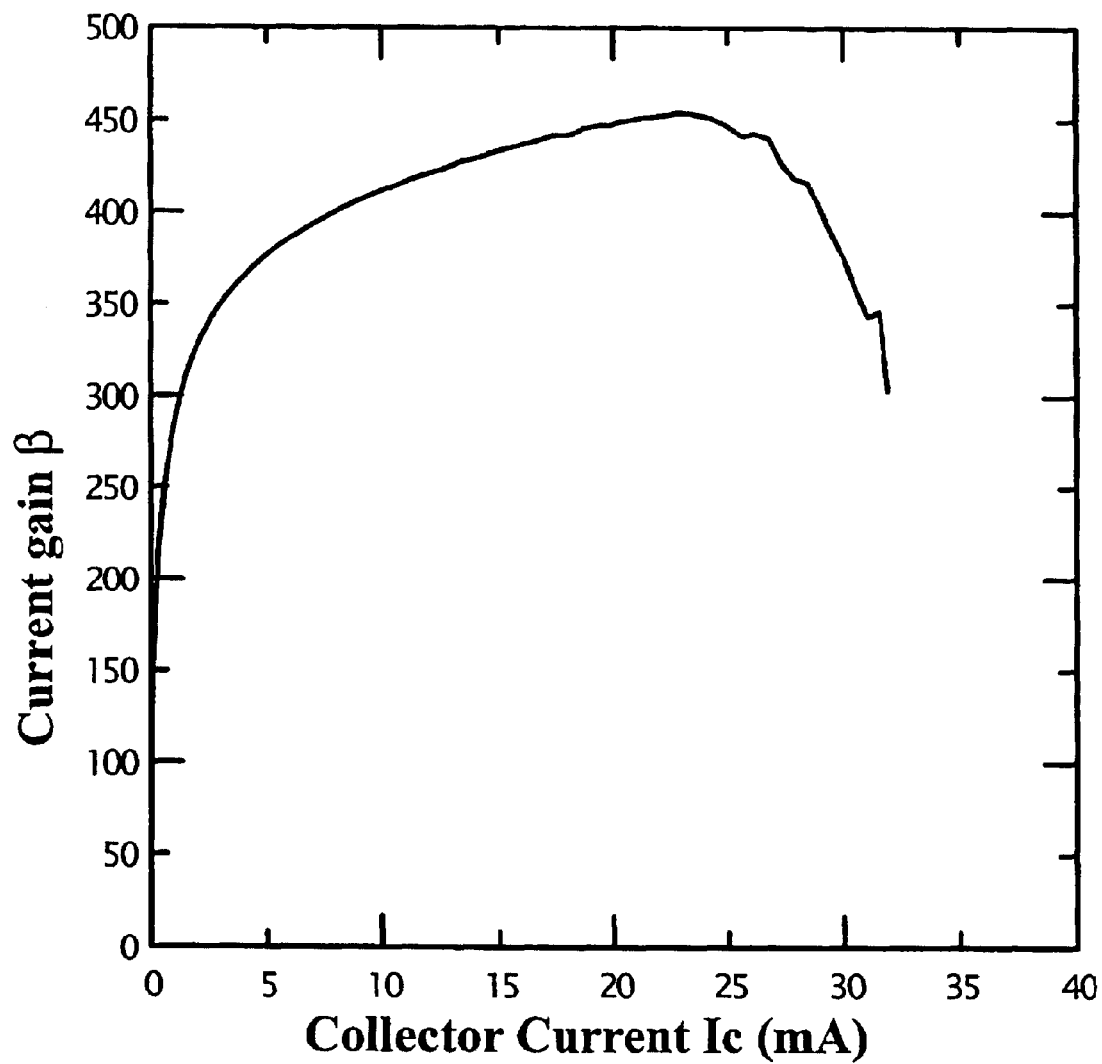
FIG. 7 shows the relationship between the current gain and the collector current of the device constructed according to the example of the present invention.

The relationship of the current gain versus the collector current is depicted in FIG. 7, when the base-collector voltage is kept at zero. It can be seen from FIG. 7 that the linearity of the current gain of the device of the present invention is high, and the maximum current gain thereof achieves 455. Besides, the current gain will achieve over 350, when the current $I_C$ increases from 3 mA to 30 mA in the present invention. Therefore, the device of the present invention is suitable for use in an operational amplifier.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

What is claimed is:

1. A structure of heterojunction bipolar transistor comprising a semi-insulated InP semiconductor substrate, a $n^+$ subcollector layer on said semi-insulated InP semiconductor substrate, a $n^-$ collector layer on said $n^+$ subcollector layer, a $p^+$ base layer on said $n^-$ collector layer, a first non-doped spacer layer on said $p^+$ base layer, a $n^+$ δ-doped layer on said first non-doped spacer layer, a second non-doped spacer layer on said $n^+$ δ-doped layer, a n-type emitter layer on said second non-doped spacer layer, and a $n^+$ ohmic contact layer on said n-type emitter layer.

2. The structure according to claim 1, wherein said $n^+$ subcollector layer is $Ga_{0.47}In_{0.53}As$, and has a thickness of 0.2 to 1 μm, and a concentration of $n=1\times10^{18}$ to $3\times10^{19}$ $cm^{-3}$.

3. The structure according to claim 1, wherein said $n^-$ collector layer is $Ga_{0.47}In_{0.53}As$, and has a thickness of 0.2 to 1 μm, and a concentration of $n^-=1\times10^{16}$ to $1\times10^{17}$ $cm^{-3}$.

4. The structure according to claim 1, wherein said $p^+$ base layer is $Ga_{0.47}In_{0.53}As$, and has a thickness of 0.05 to 0.2 μm, and a concentration of $p=1\times10^{18}$ to $4\times10^{19}$ $cm^{-3}$.

5. The structure according to claim 1, wherein said first non-doped spacer is $Ga_{0.47}In_{0.53}As$, and has a thickness of 10 to 200 Å.

6. The structure according to claim 1, wherein said $n^+$ δ-doped layer has a concentration of $\delta(n^+)=1\times10^{12}$ to $1\times10^{13}$ $cm^{-3}$.

7. The structure according to claim 1, wherein said second non-doped spacer is $Ga_{0.47}In_{0.53}As$, and has a thickness of 10 to 200 Å.

8. The structure according to claim 1, wherein said n-type emitter layer is InP or $Al_{0.48}In_{0.52}As$, and has a thickness of 0.05 to 0.2 μm, and a concentration of $n=1\times10^{17}$ to $1\times10^{18}$ $cm^{-3}$.

9. The structure according to claim 1, wherein said $n^+$ ohmic contact layer is $Ga_{0.47}In_{0.53}As$, and has a thickness of 0.1 to 0.5 μm, and a concentration of $n=1\times10^{18}$ to $3\times10^{19}$ $cm^{-3}$.

10. A structure of heterojunction bipolar transistor comprising a semi-insulated GaAs semiconductor substrate, a $n^+$ subcollector layer on said semi-insulated GaAs semiconductor substrate, a $n^-$ collector layer on said $n^+$ subcollector layer, a $p^+$ base layer on said $n^-$ collector layer, a first non-doped spacer layer on said $p^+$ base layer, a $n^+$ δ-doped layer on said first non-doped spacer layer, a second non-doped spacer layer on said $n^+$ δ-doped layer, a n-type emitter layer on said second non-doped spacer layer, and a $n^+$ ohmic contact layer on said n-type emitter layer.

11. The structure according to claim 10, wherein said $n^+$ subcollector layer is GaAs, and has a thickness of 0.2 to 1 μm, and a concentration of $n=1\times10^{18}$ to $3\times10^{19}$ $cm^{-3}$.

12. The structure according to claim 10, wherein said $n^-$ collector layer is GaAs, and has a thickness of 0.2 to 1 μm, and a concentration of $n^-=1\times10^{16}$ to $1\times10^{17}$ $cm^{-3}$.

13. The structure according to claim 10, wherein said $p^+$ base layer is GaAs, and has a thickness of 0.05 to 0.2 μm, and a concentration of $p=1\times10^{18}$ to $4\times10^{19}$ $cm^{-3}$.

14. The structure according to claim 10, wherein said first non-doped spacer is GaAs, and has a thickness of 10 to 200 Å.

15. The structure according to claim 10, wherein said $n^+$ δ-doped layer has a concentration of $\delta(n^+)=1\times10^{12}$ to $1\times10^{13}$ $cm^{-3}$.

16. The structure according to claim 10, wherein said second non-doped spacer is GaAs, and has a thickness of 10 to 200 Å.

17. The structure according to claim 10, wherein said n-type emitter layer is $In_{0.5}Ga_{0.5}P$ or $Al_xGa_{1-x}As$, wherein x is of 02 to 0.55, and has a thickness of 0.05 to 0.2 μm, and a concentration of $n=1\times10^{17}$ to $1\times10^{18}$ $cm^{-3}$.

18. The structure according to claim 10, wherein said $n^+$ ohmic contact layer is GaAs, and has a thickness of 0.1 to 0.5 μm, and a concentration of $n=1\times10^{18}$ to $3\times10^{19}$ $cm^{-3}$.

* * * * *